(12) United States Patent
Ikoma et al.

(10) Patent No.: US 7,042,278 B2
(45) Date of Patent: May 9, 2006

(54) VOLTAGE REFERENCE CIRCUIT WITH REDUCED POWER CONSUMPTION

(75) Inventors: Heiji Ikoma, Ikoma-gun (JP); Yoshitsugu Inagaki, Kyoutanabe (JP); Koji Oka, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 41 days.

(21) Appl. No.: 10/844,320

(22) Filed: May 13, 2004

(65) Prior Publication Data

US 2004/0245979 A1    Dec. 9, 2004

(30) Foreign Application Priority Data

May 13, 2000   (JP)   ............................. 2003-134663

(51) Int. Cl.
G05F 3/02 (2006.01)
(52) U.S. Cl. ....................... 327/538; 327/543; 365/229
(58) Field of Classification Search ................ 327/530, 327/538, 540, 541, 543; 365/229
See application file for complete search history.

(56) References Cited

U.S. PATENT DOCUMENTS

| | | | | |
|---|---|---|---|---|
| 4,683,382 A | * | 7/1987 | Sakurai et al. ............... | 327/544 |
| 5,249,155 A | * | 9/1993 | Arimoto et al. ............ | 365/222 |
| 5,300,823 A | * | 4/1994 | Ihara .......................... | 327/544 |
| 5,446,697 A | * | 8/1995 | Yoo et al. ................... | 365/226 |
| 5,493,234 A | * | 2/1996 | Oh ............................... | 326/33 |
| 5,821,808 A | * | 10/1998 | Fujima ........................ | 327/541 |
| 5,994,950 A | | 11/1999 | Ochi ........................... | 327/543 |
| 6,069,833 A | * | 5/2000 | Koura ......................... | 365/226 |
| 6,313,694 B1 | * | 11/2001 | Sohn ........................... | 327/541 |
| 6,512,705 B1 | * | 1/2003 | Koelling et al. ........ | 365/189.11 |
| 6,545,530 B1 | | 4/2003 | Jordan ........................ | 327/540 |
| 6,628,555 B1 | * | 9/2003 | Kondo et al. .......... | 365/189.09 |
| 6,661,279 B1 | * | 12/2003 | Yabe .......................... | 327/546 |
| 2002/0080676 A1 | * | 6/2002 | Scott .......................... | 365/229 |
| 2004/0190361 A1 | * | 9/2004 | Tokui et al. ................ | 365/226 |

FOREIGN PATENT DOCUMENTS

| | | |
|---|---|---|
| JP | 10150152 | 6/1998 |
| JP | 2002-83494 | 3/2002 |

\* cited by examiner

Primary Examiner—Terry D. Cunningham
(74) Attorney, Agent, or Firm—Wenderoth, Lind & Ponack, L.L.P.

(57) ABSTRACT

A semiconductor integrated circuit is provided with a reference voltage generation circuit for generating a voltage to be a reference, a function circuit that is operated using an output voltage of the reference voltage generation circuit, and a reference voltage stabilization capacitor for stabilizing the output voltage, which is connected to an output terminal of the reference voltage generation circuit. During standby, the function circuit stops operating while the reference voltage generation circuit continues operating to prevent discharging of the reference voltage stabilization capacitor, thereby realizing reduction in power consumption of the function circuit such as an analog circuit as well as high-speed recovery from the standby state to the normal operation state.

6 Claims, 9 Drawing Sheets

VOLTAGE REFERENCE CIRCUIT WITH REDUCED POWER CONSUMPTION

FIELD OF THE INVENTION

The present invention relates to semiconductor integrated circuits and, more particularly, to a semiconductor integrated circuit provided with a reference voltage generation circuit.

BACKGROUND OF THE INVENTION

In a system LSI on which a digital circuit block and an analog circuit block having relatively large power consumption coexist, reduction in power consumption in the analog circuit block has become a major challenge. Particularly, demand for such reduction in power consumption grows for portable equipment. In portable equipment, a power supply of a mounted analog circuit block is turned on/off at an appropriate timing according to the usage state, thereby to reduce power consumption. For example, in a communication system including a transmitter and a receiver, the receiver is halted during transmission while the transmitter is halted during reception.

FIG. 10 is a block diagram illustrating a conventional semiconductor integrated circuit included in such system LSI. In FIG. 10, 801 denotes a reference voltage generation circuit for generating a voltage to be a reference, 802 denotes an analog circuit that is operated using the reference voltage generated in the reference voltage generation circuit 801, and 803 denotes a reference voltage stabilization capacitor for stabilizing an output voltage of the reference voltage generation circuit 801. Further, Pdn denotes a standby signal which turns off the reference voltage generation circuit 801 and the analog circuit 802 when it is "H", and turns on these circuits when it is "L". Furthermore, Vr denotes an output of the reference voltage generation circuit 801, and it is stabilized by the reference voltage stabilization capacitor 3 (for example, refer to Japanese Patent No. 3080015 (pages 3 and 4, FIGS. 1 and 3)). FIG. 11 is a waveform chart illustrating a change in the output voltage Vr when the standby signal changes between "L" and "H". In FIG. 11, tr denotes a recovery time required until the output voltage Vr attains a stable reference voltage Vr0. In the conventional example, as shown in FIG. 11, the time tr is required for charging the reference voltage stabilization capacitor 803 from standby to normal operation, and the time tr causes a delay in recovery.

In the conventional reference voltage generation circuit, the time tr is required for the reference voltage Vr to reach the stable reference voltage Vr0 after canceling of standby, and sometimes a recovery time requested by the system is not satisfied. Especially in a semiconductor integrated circuit having a large reference voltage stabilization capacitor 803, the time required for charging the capacitor increases, resulting in a considerable increase in the recovery time tr.

SUMMARY OF THE INVENTION

The present invention is made to solve the above-mentioned problems and has for its object to provide a semiconductor integrated circuit that can reduce power consumption in a function circuit such as an analog circuit, and that can reduce the recovery time from the standby state to the normal operation state.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a semiconductor integrated circuit comprising a reference voltage generation circuit for generating a voltage to be a reference, a function circuit that is operated using an output voltage of the reference voltage generation circuit, and a reference voltage stabilization capacitor for stabilizing the output voltage, which is connected to an output terminal of the reference voltage generation circuit, wherein, during standby, the function circuit stops operating, and the reference voltage generation circuit continues operating. Therefore, it is not necessary to recharge the reference voltage stabilization capacitor when standby is canceled, resulting in reduction in power consumption of the function circuit such as an analog circuit as well as shortening of recovery time that is required for the analog circuit to recover to normal operation.

According to a second aspect of the present invention, in the semiconductor integrated circuit according to the first aspect, the reference voltage generation circuit decreases current consumption by a predetermined amount during standby. Since the reference voltage stabilization capacitor is not completely discharged, it is possible to shorten recovery time from the standby state to the normal operation state, thereby further reducing power consumption during standby.

According to a third aspect of the present invention, in the semiconductor integrated circuit according to the second aspect, the reference voltage generation circuit changes a current supply to reduce current consumption during standby. Therefore, it is possible to shorten recovery time from the standby state to the normal operation state, thereby further reducing power consumption during standby.

According to a fourth aspect of the present invention, in the semiconductor integrated circuit according to the second aspect, during standby, the reference voltage generation circuit outputs the same voltage as during normal operation. Therefore, it is possible to achieve reduction in power consumption during standby, and further shortening of recovery time from the standby state to the normal operation state.

According to a fifth aspect of the present invention, in the semiconductor integrated circuit according to the second aspect, the reference voltage circuit comprises N (N: natural number not less than 2) pieces of current supplies connected in parallel and N pieces of resistive loads connected in parallel, which are connected to the output terminal of the reference voltage generation circuit; and during standby, among the N pieces of current supplies and the N pieces of resistive loads, M (M: natural number not less than 1) pieces of current supplies and M pieces of resistive loads are disconnected from the output terminal. Since the output terminal voltage at standby becomes equal to that at normal operation, it is not necessary to recharge the reference voltage stabilization capacitor even when standby is canceled. Therefore, it is possible to shorten recovery time that is required for the analog circuit to recover to normal operation, thereby further reducing power consumption during standby.

According to a sixth aspect of the present invention, in the semiconductor integrated circuit according to the fifth aspect, the resistive loads are transistors. Therefore, it is possible to shorten recovery time from the standby state to the normal operation state by using the transistors, thereby further reducing power consumption during standby.

According to a seventh aspect of the present invention, in the semiconductor integrated circuit according to the first aspect, the reference voltage generation circuit is provided with a clock input terminal which enables inputting of a clock signal, and a clock-frequency-dependent current supply whose current value varies in proportion to the frequency of the inputted clock signal; and during standby, the clock frequency is reduced to decrease current consumption of the clock-frequency-dependent current supply by a predetermined amount. Therefore, it is possible to shorten recovery time from the standby state to the normal operation state by varying the clock frequency, thereby further reducing power consumption during standby. Further, the number of current supplies is reduced, thereby reducing the circuit scale.

According to an eighth aspect of the present invention, in the semiconductor integrated circuit according to the seventh aspect, the reference voltage generation circuit comprises N (N: natural number not less than 2) pieces of resistive loads connected in parallel, which are connected to the output terminal of the reference voltage generation circuit; and during standby, M (M: natural number not less than 1) pieces of resistive loads among the N pieces of resistive loads are disconnected from the output terminal. Since the output terminal voltage at standby becomes equal to that at normal operation, it is not necessary to recharge the reference voltage stabilization capacitor even when standby is canceled. Therefore, it is possible to shorten recovery time that is required for the analog circuit to recover to normal operation, thereby further reducing power consumption during standby.

According to a ninth aspect of the present invention, in the semiconductor integrated circuit according to the eighth aspect, the resistive loads are transistors. Therefore, it is possible to shorten recovery time from the standby state to the normal operation state by using the transistors, thereby further reducing power consumption during standby.

According to a tenth aspect of the present invention, in the semiconductor integrated circuit according to any of the seventh to ninth aspects, the reference voltage generation circuit is provided with a frequency divider for reducing the inputted clock signal; during normal operation, a clock signal is input to the clock-frequency-dependent current supply by bypassing the frequency divider; and during standby, a clock signal is input to the frequency-dependent current supply via the frequency divider. Therefore, it is possible to shorten recovery time from the standby state to the normal operation state by using the clock signal of a constant frequency, thereby further reducing power consumption during standby. Furthermore, the system design is simplified.

DETAILED DESCRIPTION OF THE PREFERRED EMBODIMENT

Embodiment 1

Figure 1:
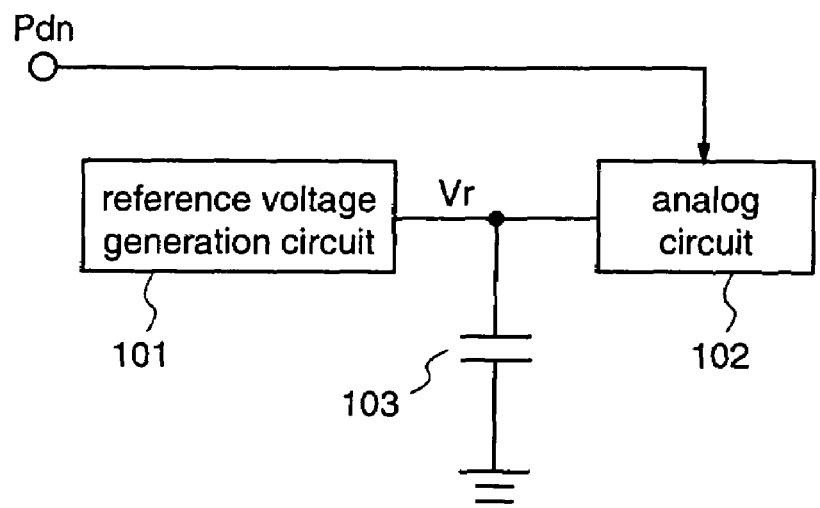
FIG. 1 is a block diagram illustrating a semiconductor integrated circuit according to a first embodiment of the present invention.
Figure 1:
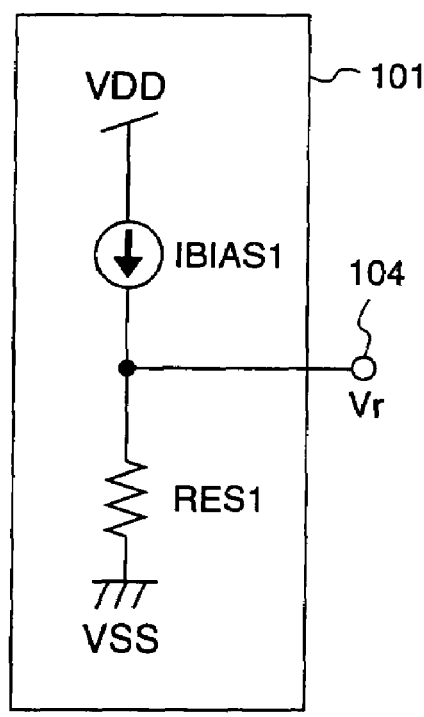

FIG. 1(a) is a block diagram illustrating a semiconductor integrated circuit according to a first embodiment of the present invention.

In FIG. 1(a), 101 denotes a reference voltage generation circuit for generating a voltage to be a reference, 102 denotes an analog circuit that is operated using an output voltage Vr of the reference voltage generation circuit 101, and numeral 103 denotes a reference voltage stabilization capacitor for stabilizing the output voltage Vr of the reference voltage generation circuit 101.

In this first embodiment, an output terminal of the reference voltage generation circuit 101 is connected to an input terminal of the analog circuit 102, and the analog circuit 102 is operated using the output voltage Vr of the reference voltage generation circuit 101. Further, in order to stabilize the output voltage Vr, the reference voltage stabilization capacitor 103 is connected between the output terminal of the reference voltage generation circuit 101 and the ground. A standby signal Pdn is not input to the reference voltage generation circuit 101 but input to the analog circuit 102. The analog circuit 102 is turned off when the standby signal Pdn is "H" while it is turned on when the signal Pdn is "L".

FIG. 1(b) is a diagram illustrating the reference voltage generation circuit 101 included in the semiconductor integrated circuit according to the first embodiment. In FIG. 1(b), the reference voltage generation circuit 101 comprises a current supply IBIAS1 and a resistor element RES1. The output of the current supply IBIAS1 is connected to one end of the resistor element RES1 and to an output terminal 104 of the reference voltage generation circuit 101. The other end of the resistance element RES1 is grounded.

Next, the operation of the semiconductor integrated circuit according to the first embodiment will be described.

Figure 2:
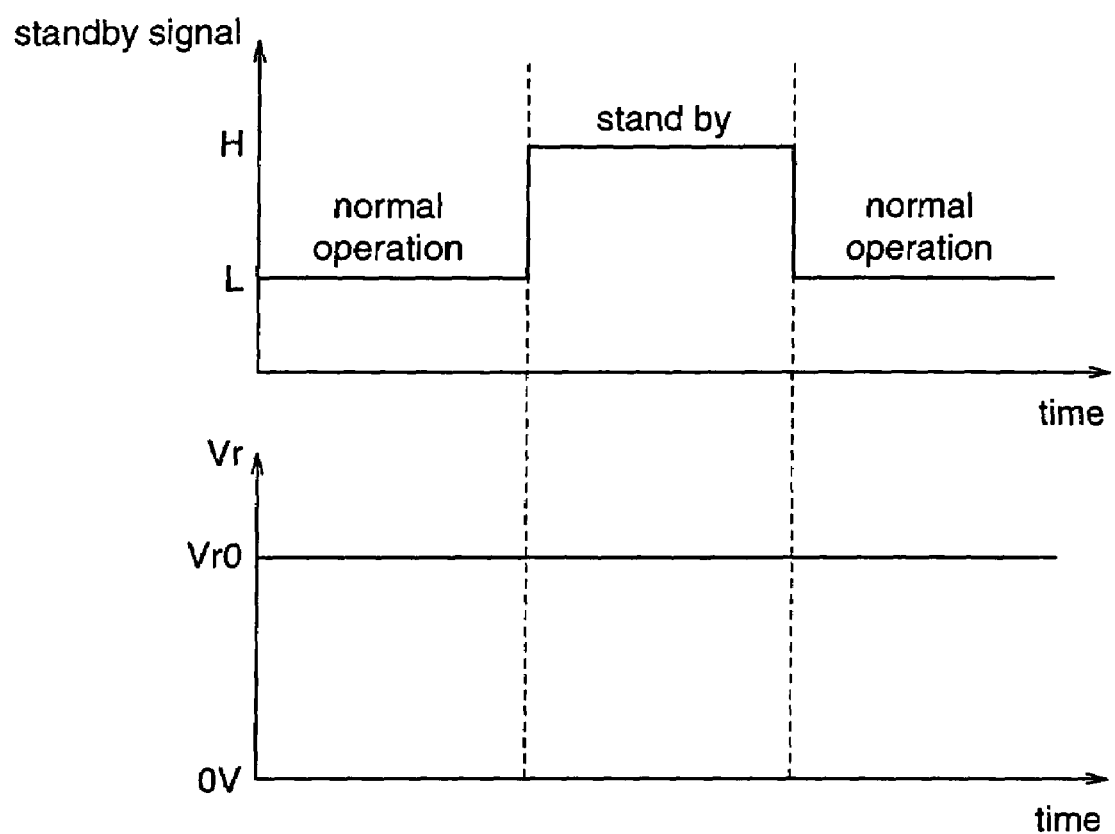
FIG. 2 is a waveform chart illustrating an output voltage of a reference voltage generation circuit according to the first embodiment.

During standby, the analog circuit 102 to which the standby signal is input is halted while the reference voltage generation circuit 101 is operated, thereby to reduce power consumption. At this time, since no standby signal Pdn is input to the reference voltage generation circuit 101, the reference voltage generation circuit 101 is not halted. Therefore, as shown in the output voltage waveform chart of FIG. 2, the output voltage Vr does not change even when the standby signal is "H", i.e., during standby, and the electric charge stored in the reference voltage stabilization capacitor 103 is not discharged.

Accordingly, it is not necessary to recharge the reference voltage stabilization capacitor 103 even when the standby signal is L, i.e., when standby is canceled, leading to a reduction in time required for the analog circuit 102 to recover to normal operation.

As described above, in the semiconductor integrated circuit according to the first embodiment, since the voltage of the reference voltage generation circuit 101 is not reduced even during standby, recharging of the reference voltage stabilization capacitor 103 becomes unnecessary after cancellation of standby, leading to a reduction in power consumption of the analog circuit 102 as well as a reduction in recovery time from the standby state to the normal operation state.

While in this first embodiment the reference voltage stabilization capacitor is connected between the output terminal of the reference voltage generation circuit and the ground, the reference voltage stabilization capacitor may be connected between the output terminal and the power supply, with the same effects as mentioned above. Further, the reference voltage stabilization capacitor is not necessarily connected to the output terminal of the reference voltage generation circuit.

Embodiment 2

In a semiconductor integrated circuit according to a second embodiment of the present invention, when a standby signal is inputted, current consumption in the reference voltage generation circuit is reduced by a predetermined amount from current consumption during normal operation, in order to achieve a reduction in recovery time from the standby state to the normal operation state as well as a reduction in power consumption.

Figure 3:
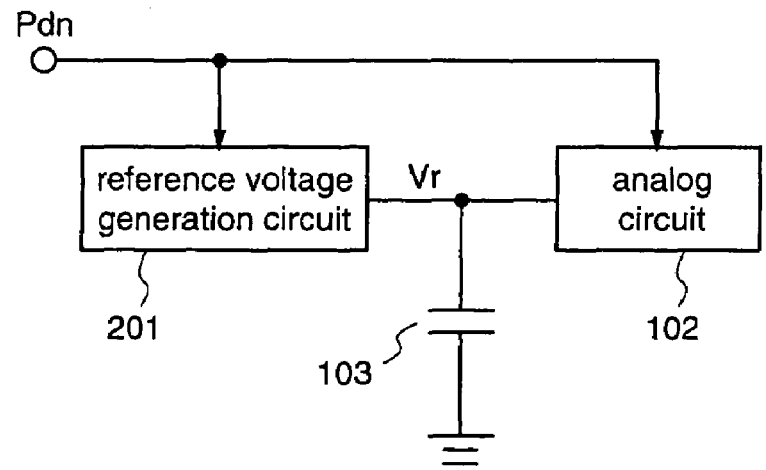
FIG. 3 is a block diagram illustrating a semiconductor integrated circuit according to a second embodiment of the present invention.
Figure 3:
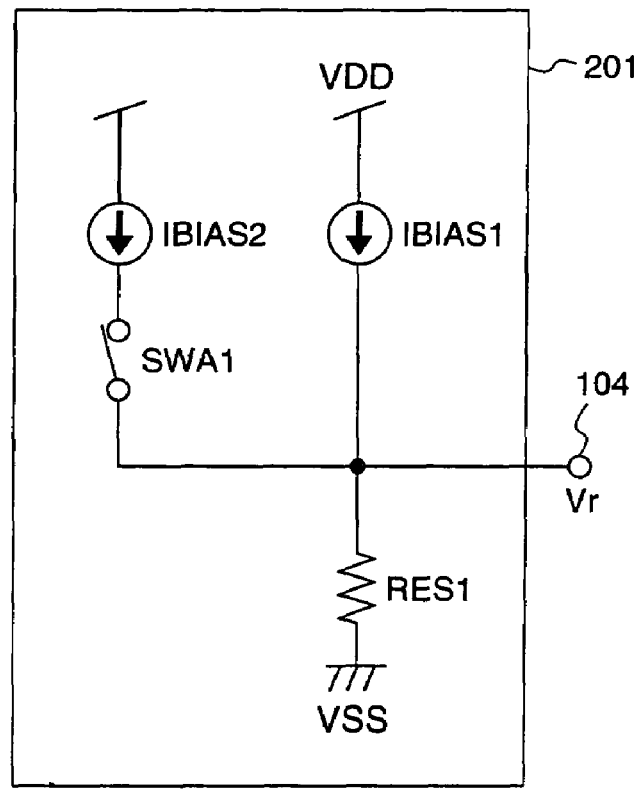

FIG. 3(a) is a block diagram illustrating a semiconductor integrated circuit according to a second embodiment of the present invention.

In FIG. 3(a), 201 denotes a reference voltage generation circuit for generating a voltage to be a reference, 102 denotes an analog circuit that is operated using an output voltage Vr of the reference voltage generation circuit 101, and numeral 103 denotes a reference voltage stabilization capacitor for stabilizing the output voltage Vr of the reference voltage generation circuit 101.

In this second embodiment, an output terminal of the reference voltage generation circuit 201 is connected to an input terminal of the analog circuit 102, and the analog circuit 102 is operated using the output voltage Vr of the reference voltage generation circuit 201. Further, in order to stabilize the output voltage Vr, the reference voltage stabilization capacitor 103 is connected between the output terminal of the reference voltage generation circuit 201 and the ground. A standby signal Pdn is input to the reference voltage generation circuit 201 and the analog circuit 102, whereby the reference voltage generation circuit 201 and the analog circuit 102 are turned off when the standby signal Pdn is "H" while these circuits are turned on when the signal Pdn is "L". The reference voltage generation circuit 201 is constructed so as to reduce current consumption by a predetermined amount at inputting of the standby signal. Alternatively, the reference voltage generation circuit 201 may be provided with plural current supplies of different amounts of current consumption (in this embodiment, two current supplies), and a current supply of a lower current consumption may be selected during standby to reduce current consumption. The amount of current consumption to be reduced at this time may be arbitrarily set so long as it satisfies a recovery time required by the system.

FIG. 3(b) is a diagram illustrating the reference voltage generation circuit included in the semiconductor integrated circuit according to the second embodiment. In FIG. 3(b), the reference voltage generation circuit 201 comprises two current supplies IBIAS1 and IBIAS2, a switch SWA1, and a resistor element RES1. The output of the current supply IBIAS1 is connected to one end of the resistor element RES1 and to an output terminal 104 of the reference voltage generation circuit 201. The output of the current supply IBIAS2 is connected to the one end of the resistor element RES1 through the switch SWA1 and to the output terminal 104 of the reference voltage generation circuit 201. The other terminal of the resistor element RES1 is connected to the ground.

Next, the operation of the semiconductor integrated circuit according to the second embodiment will be described.

During normal operation, the switch SWA1 is closed, whereby the currents from the current supplies IBIAS1 and IBIAS2 flow into the resistor element RES1 to generate an output terminal voltage Vr.

During standby, the standby signal Pdn is input to the reference voltage generation circuit 201 and the analog circuit 102, whereby the analog circuit 102 comes to a halt, and the switch SWA1 is opened to turn off the current supply IBIAS2 in the reference voltage generation circuit 201. On the other hand, the circuit comprising the current supply IBIAS1 and the resistor element RES1 continues to operate even during standby. Thereby, the reference voltage generation circuit 201 is operated with current consumption smaller than that required in normal operation to reduce the output voltage. At this time, as shown in the output voltage waveform chart of FIG. 4, the output voltage Vr is reduced (drops) when the standby signal is "H", i.e., during standby, and some of the electric charge stored in the reference voltage stabilization capacitor 103 is discharged but the charge is not completely discharged. When the standby signal is "L", i.e., when the standby is canceled, the output voltage recovers to the voltage at normal operation, with recovery time tr, while charging the reference voltage stabilization capacitor 103. Therefore, it is not necessary to recharge the standard voltage stabilization capacitor 103 from its initial state, whereby the recovery time from the standby state to the normal operation state is reduced, and power consumption during standby is further reduced.

In this second embodiment, during standby, current consumption of the reference voltage generation circuit 201 is reduced and thereby the output voltage Vr is lowered. However, when the output voltage Vr does not change even though current consumption is reduced, the recovery time from the standby state to the normal operation state is further reduced.

As described above, in the semiconductor integrated circuit according to the second embodiment, the analog circuit 102 is halted during standby to reduce power consumption of the reference voltage generation circuit 201, resulting in a reduction in recovery time from the standby state to the normal operation state as well as a further reduction in power consumption during standby.

Embodiment 3

According to a third embodiment of the present invention, in order to achieve a reduction in recovery time from the standby state to the normal operation state as well as a reduction in power consumption during standby, the reference voltage generation circuit according to the second embodiment is provided with, N (N: natural number not less than 2) pieces of current supplies connected in parallel, and N pieces of resistive loads connected in parallel, and M (M: natural number not less than 1) pieces of current supplies and M pieces of resistive loads are disconnected during standby.

Figure 5:
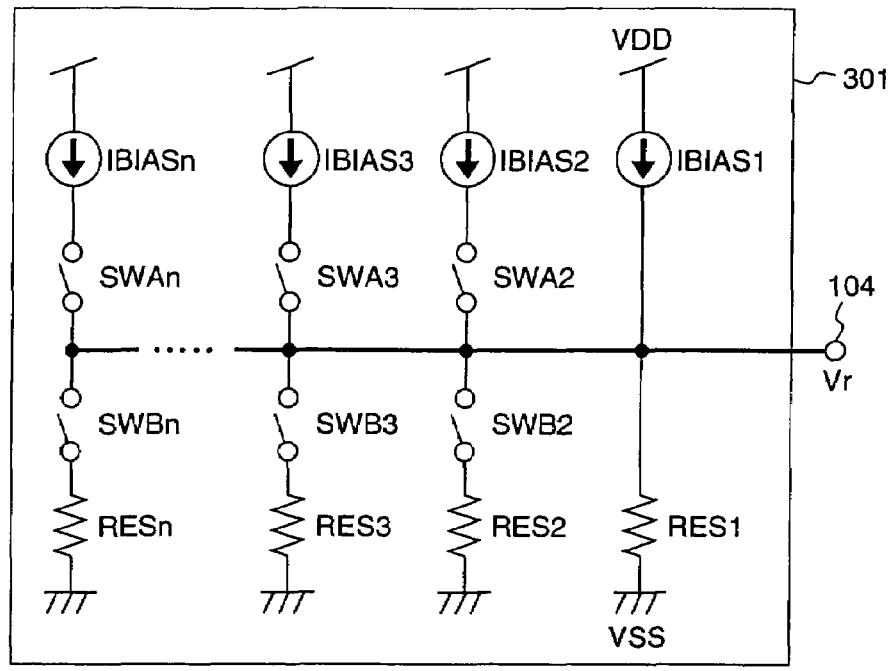
FIG. 5 is a block diagram illustrating a reference voltage generation circuit according to a third embodiment of the present invention.

FIG. 5 is a diagram illustrating a reference voltage generation circuit included in the semiconductor integrated circuit according to the third embodiment.

In FIG. 5, a reference voltage generation circuit 301 comprises N pieces of current supplies IBIAS1~IBIASn, N pieces of switches SWA2~SWAn, N pieces of switches SWB2~SWBn, and N pieces of resistor elements RES1~RESn. The output of the current supply IBIAS1 is connected to one end of the resistor element RES1 and to an output terminal 104 of the reference voltage generation circuit 301. The other end of the resistor element RES1 is connected to the ground.

The output of the current supply IBIAS2 is connected to the output terminal 104 through the switch SWA2, and the resistor element RES2 having one end connected to the ground is connected to the output terminal 104 through the switch SWB2. Hereinafter, similar connection is repeated up to IBIASn and RESn. In this third embodiment, it is assumed that the current supplies IBIAS1~IBIASn have the same current value, and the resistor elements RES1~RESn have the same resistance values.

Next, the operation of the semiconductor integrated circuit according to the third embodiment will be described.

During normal operation, the switches SWA2~SWAn and the switches SWB2~SWBn are closed, and currents flow from the current supplies IBIAS1~IBIASn to the resistor elements RES1~RESn to generate an output terminal voltage Vr.

During standby, the switches SWA2~SWAn and the switches SWB2~SWBn are opened by the standby signal, whereby the current supplies IBIAS2~IBIASn are turned off, and no current flows in the resistor elements RES2~RESn. On the other hand, the circuit constituted by the current supply IBIAS1 and the resistor element RES1 continues to operate even during standby. In this case, the current from each current supply becomes 1/n of that at normal operation, and the resistance of the resistor element becomes n times as high as that at normal operation, and therefore, the output terminal voltage is equal to that at normal operation. Accordingly, as shown in the output voltage waveform chart of FIG. 2, the output voltage Vr does not change even at standby, and the electric charge stored in the reference voltage stabilization capacitor 103 does not change.

Therefore, it is not necessary to recharge the reference voltage stabilization capacitor 103 when standby is canceled, resulting in a reduction in time required for the analog circuit to recover to the normal operation state.

As described above, in the semiconductor integrated circuit according to the third embodiment, the reference voltage generation circuit 301 is provided with the N pieces of current supplies IBIAS and the N pieces of resistive loads (resistor elements) RES. Among the N pieces of current supplies and the N pieces of resistive loads, M pieces of current supplies and M pieces of resistive loads are disconnected during standby. Therefore, a further reduction in power consumption is achieved during standby, and a reduction in recovery time from the standby state to the normal operation state is achieved because the output terminal voltage is unchanged from that at normal operation.

Embodiment 4

According to a fourth embodiment of the present invention, in order to achieve a reduction in recovery time from the standby state to the normal operation state as well as a reduction in power consumption during standby, the reference voltage generation circuit according to the second embodiment is provided with N (N: natural number not less than 2) pieces of current supplies connected in parallel, and N pieces of transistors as resistive loads connected in parallel, and M (M: natural number not less than 1) pieces of current supplies and M pieces of transistors are disconnected during standby.

Figure 6:
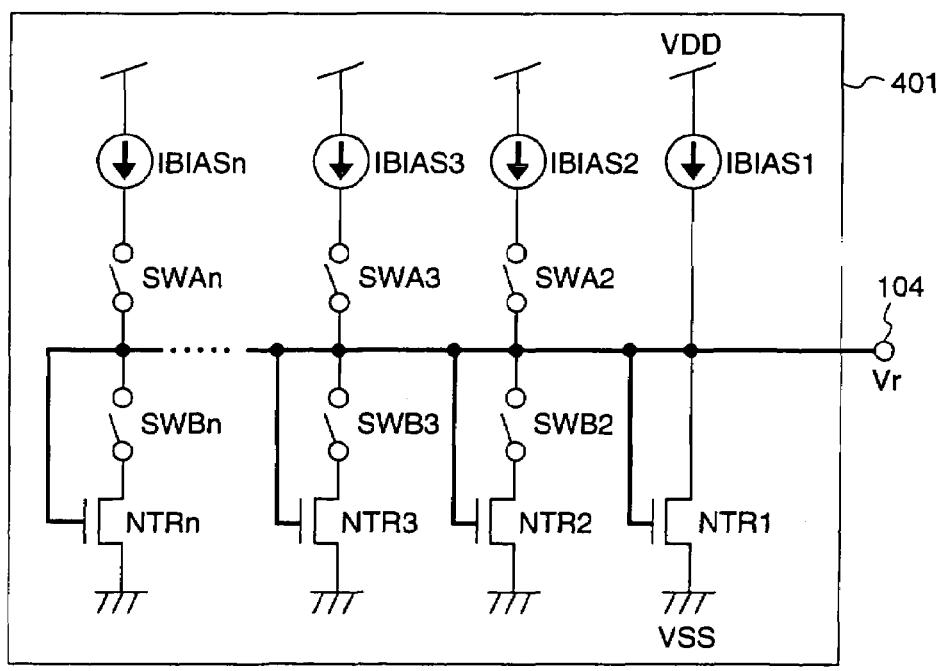
FIG. 6 is a block diagram illustrating a reference voltage generation circuit according to a fourth embodiment of the present invention.

FIG. 6 is a diagram illustrating a semiconductor integrated circuit according to the fourth embodiment. While in the third embodiment resistor elements are used as resistive loads, transistors are used in this fourth embodiment.

In FIG. 6, a reference voltage generation circuit 401 comprises current supplies IBIAS1~IBIASn, switches SWA2~SWAn, switches SWB2~SWBn, and N channel transistors NTR1~NTRn. The output of the current supply IBIAS1 is connected to a drain terminal and a gate terminal of the N channel transistor NTR1 and to an output terminal 104 of the reference voltage generation circuit 401. The output of the current supply IBIAS2 is connected to the output terminal 104 through the switch SWA2. A drain terminal of the N channel transistor NTR2 is connected to the output terminal 104 through the switch SWB2, and a gate terminal of the N channel transistor NTR2 is also connected to the output terminal 104. Hereinafter, similar connection is repeated up to IBIASn and NTRn. In this fourth embodiment, it is assumed that the current supplies IBIAS1~IBIASn have the same current value, and the transistors NTR1~NTRn have the same channel size.

Next, the operation of the semiconductor integrated circuit according to the fourth embodiment will be described.

During normal operation, the switches SWA2~SWAn and the switches SWB2~SWBn are closed. At this time, since the N channel transistors NTR1~NTRn function as resistive loads, currents from the current supplies IBIAS1~IBIASn flow in the transistors, thereby generating an output terminal voltage Vr.

During standby, the switches SWA2~SWAn and the switches SWB2~SWBn are opened by the standby signal, whereby the current supplies IBIAS2~IBIASn are turned off, and no current flows in the N channel transistors NTR2~NTRn as resistive loads. On the other hand, the circuit constituted by the current supply IBIAS1 and the N channel transistor NTR1 as a resistive load continues to operate even during standby. In this case, the current from each current supply becomes 1/n of that at normal operation, and the size of each N channel transistor becomes 1/n of that at normal operation, and therefore, the output terminal voltage remains unchanged from that at normal operation. Accordingly, as shown in the output voltage waveform chart of FIG. 2, the output voltage Vr does not change even at standby, and the electric charge stored in the reference voltage stabilization capacitor 103 does not change.

Therefore, it is not necessary to recharge the reference voltage stabilization capacitor 103 when standby is canceled, resulting in a reduction in time required for the analog circuit to recover to the normal operation state.

As described above, in the semiconductor integrated circuit according to the fourth embodiment, the reference voltage generation circuit 401 is provided with the N (N: natural number not less than 2) pieces of current supplies and the N pieces of transistors as resistive loads. Among the N pieces of current supplies and the N pieces of transistors, M (M: natural number not less than 1) pieces of current supplies and M pieces of transistors are disconnected during standby. Therefore, a further reduction in power consumption is achieved during standby, and a reduction in recovery time from the standby state to the normal operation state is realized because the output terminal voltage is unchanged from that at normal operation.

Embodiment 5

In a semiconductor integrated circuit according to a fifth embodiment, in order to achieve a reduction in recovery time from the standby state to the normal operation state and a reduction in power consumption during standby, the reference voltage generation circuit is provided with a clock input terminal which enables inputting of a clock signal, and a clock-frequency-dependent current supply that varies its current value in proportion to the clock frequency of the inputted clock signal, whereby the clock frequency is reduced during standby to decrease current consumption by a predetermined value.

Figure 7:
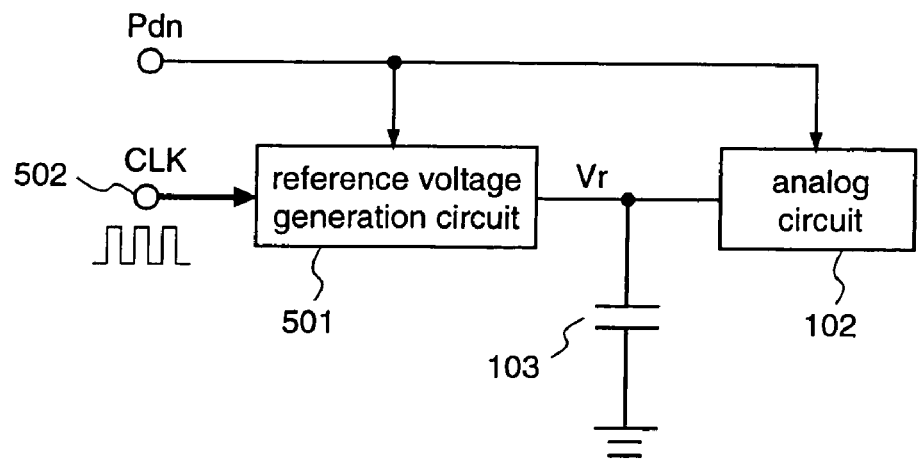
FIG. 7 is a block diagram illustrating a semiconductor integrated circuit according to a fifth embodiment of the present invention.
Figure 7:
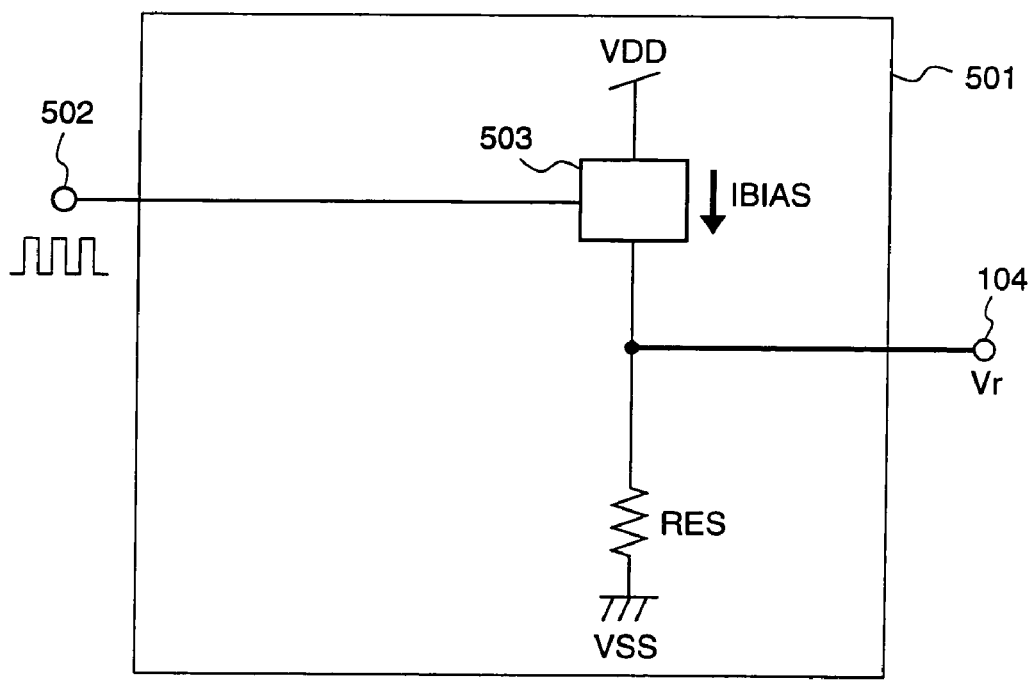

FIG. 7(a) is a block diagram illustrating the semiconductor integrated circuit according to the fifth embodiment, and FIG. 7(b) is a block diagram illustrating the reference voltage generation circuit.

In FIG. 7(a), 502 denotes a clock input terminal for inputting a clock signal to the reference voltage generation circuit 501. Further, the reference voltage generation circuit is provided with a clock-frequency-dependent current supply 503 that varies its current value in proportion to the clock frequency of the inputted clock signal.

The output terminal of the reference voltage generation circuit 501 is connected to the analog circuit 102, and the analog circuit 102 is operated using the output terminal voltage Vr of the reference voltage generation circuit 501. Further, in order to stabilize the output voltage Vr, a reference voltage stabilization capacity 103 is connected between the output terminal of the reference voltage generation circuit 501 and the ground. A standby signal Pdn is input to the reference voltage generation circuit 501 and to the analog circuit 102.

Next, the operation of the semiconductor integrated circuit according to the fifth embodiment will be described.

During standby, the analog circuit 102 is halted to reduce power consumption, and simultaneously, the frequency of the clock signal CLK is reduced to decrease the current value of the clock-frequency-dependent current supply 503. At this time, as shown in the output voltage waveform chart of FIG. 4, the output voltage Vr decreases during standby, and some of the electric charge stored in the reference voltage stabilization capacitor 103 is discharged. However, since the reference voltage generation circuit 501 is not halted, the charge stored in the reference voltage stabilization capacity 103 is not completely discharged. At this time, the current value of the clock-frequency-dependent current supply may be arbitrarily set so long as it satisfies the recovery time required from the system.

Figure 4:
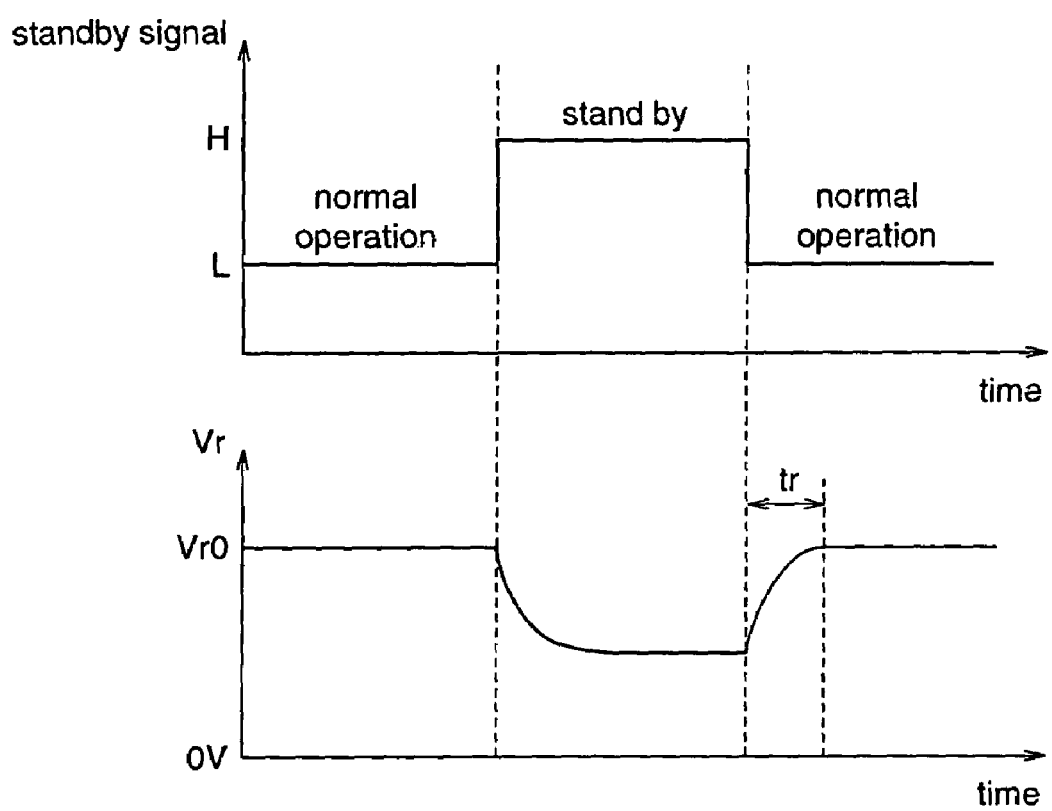
FIG. 4 is a waveform chart illustrating an output voltage of a reference voltage generation circuit according to the second embodiment.

When standby is canceled, the output voltage is recovered to the voltage level at normal operation, in the recovery time tr as shown in FIG. 4, while charging the reference voltage stabilization capacitor 103. Therefore, it is not necessary to recharge the reference voltage stabilization capacitor 103 from the initial state, resulting in a reduction in time required for the analog circuit to recover to the normal operation state.

As described above, the semiconductor integrated circuit according to the fifth embodiment is provided with the clock terminal 502 that enables inputting of a clock signal, and the clock-frequency-dependent current supply 503 that varies its current value in proportion to the frequency of the inputted clock signal, and the frequency of the inputted clock signal is reduced during standby to decrease current consumption by a predetermined value, resulting in a reduction in recovery time from the standby state to the normal operation state as well as reduction in power consumption of the reference voltage generation circuit.

Furthermore, the number of current supplies is reduced by using the clock-frequency-dependent current supply, resulting in a reduction in circuit scale.

Embodiment 6

In a semiconductor integrated circuit according to a sixth embodiment of the present invention, in order to achieve a reduction in recovery time from the standby state to the normal operation state as well as a reduction in power consumption during standby, the reference voltage generation circuit of the semiconductor integrated circuit according to the fifth embodiment is provided with N (N: natural number not less than 2) pieces of resistive loads connected in parallel. During standby, the clock frequency is reduced, and M (M: natural number not less than 1) pieces of resistive loads among the N pieces of resistive loads are disconnected.

Figure 8:
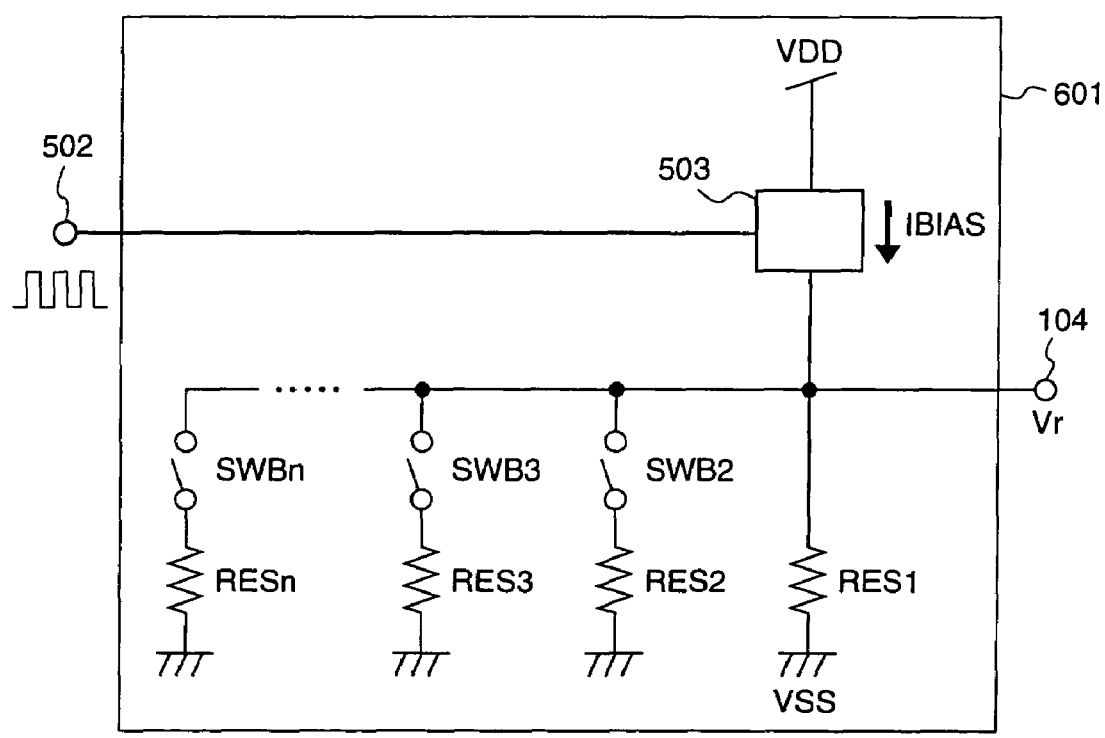
FIG. 8 is a block diagram illustrating a reference voltage generation circuit according to a sixth embodiment of the present invention.

FIG. 8 is a diagram illustrating a reference voltage generation circuit included in the semiconductor integrated circuit according to the sixth embodiment. In FIG. 8, the same reference numerals as those described for the fifth embodiment denote the same parts.

In FIG. 8, a reference voltage generation circuit 601 comprises N pieces of resistor elements RES1~RESn, and N pieces of switches SWB2~SWBn for disconnecting the resistor elements RES1~RESn from the output terminal during standby.

Next, the operation of the semiconductor integrated circuit according to the sixth embodiment will be described.

During normal operation, the switches SWB2~SWBn are closed, and the current from the frequency-dependent current supply 503 flows into the resistor elements RES1~RESn, thereby generating an output terminal voltage Vr.

During standby, the switches SWB2~SWBn are opened by the standby signal, whereby the resistor elements RES2~RESn are disconnected from the output terminal 104, and simultaneously, a clock signal having a frequency that is 1/n of the clock frequency at normal operation is input to the clock input terminal 502. In this case, the current from the clock-frequency-dependent current supply 503 becomes 1/n of that at normal operation, and the resistance of each resistor element becomes n times as high as that at normal operation, and therefore, the output terminal voltage remains unchanged from that at normal operation. Accordingly, as shown in the output voltage waveform chart of FIG. 2, the output voltage Vr does not change even at standby, and the electric charge stored in the reference voltage stabilization capacitor 103 does not change.

Therefore, it is not necessary to recharge the reference voltage stabilization capacitor 103 from the initial state when standby is canceled, resulting in a reduction in time required for the analog circuit to recover to the normal operation state.

As described above, the semiconductor integrated circuit according to the sixth embodiment is provided with the clock input terminal that enables inputting of a clock signal, the clock-frequency-dependent current supply that varies its current value in proportion to the inputted clock frequency, and the N pieces of resistor elements. During standby, M pieces resistor elements among the N pieces of resistor element are disconnected from the output terminal, resulting in a reduction in circuit scale, a reduction in recovery time from the standby state to the normal operation state, and a further reduction in power consumption during standby.

While in this sixth embodiment resistor elements are used as resistive loads, transistors may be employed.

Embodiment 7

According to a seventh embodiment of the present invention, in order to simplify system design as well as achieve a reduction in recovery time from the standby state to the normal operation state and a reduction in power consumption of the reference voltage generation circuit at standby, the reference voltage generation circuit of the semiconductor integrated circuit according to the fifth or sixth embodiment is provided with a frequency divider that reduces the frequency of an inputted clock signal to 1/N and outputs the clock signal. During standby, the frequency of the inputted clock signal is reduced to 1/N by the frequency divider during standby, and the current is varied by the clock-frequency-dependent current supply.

Figure 9:
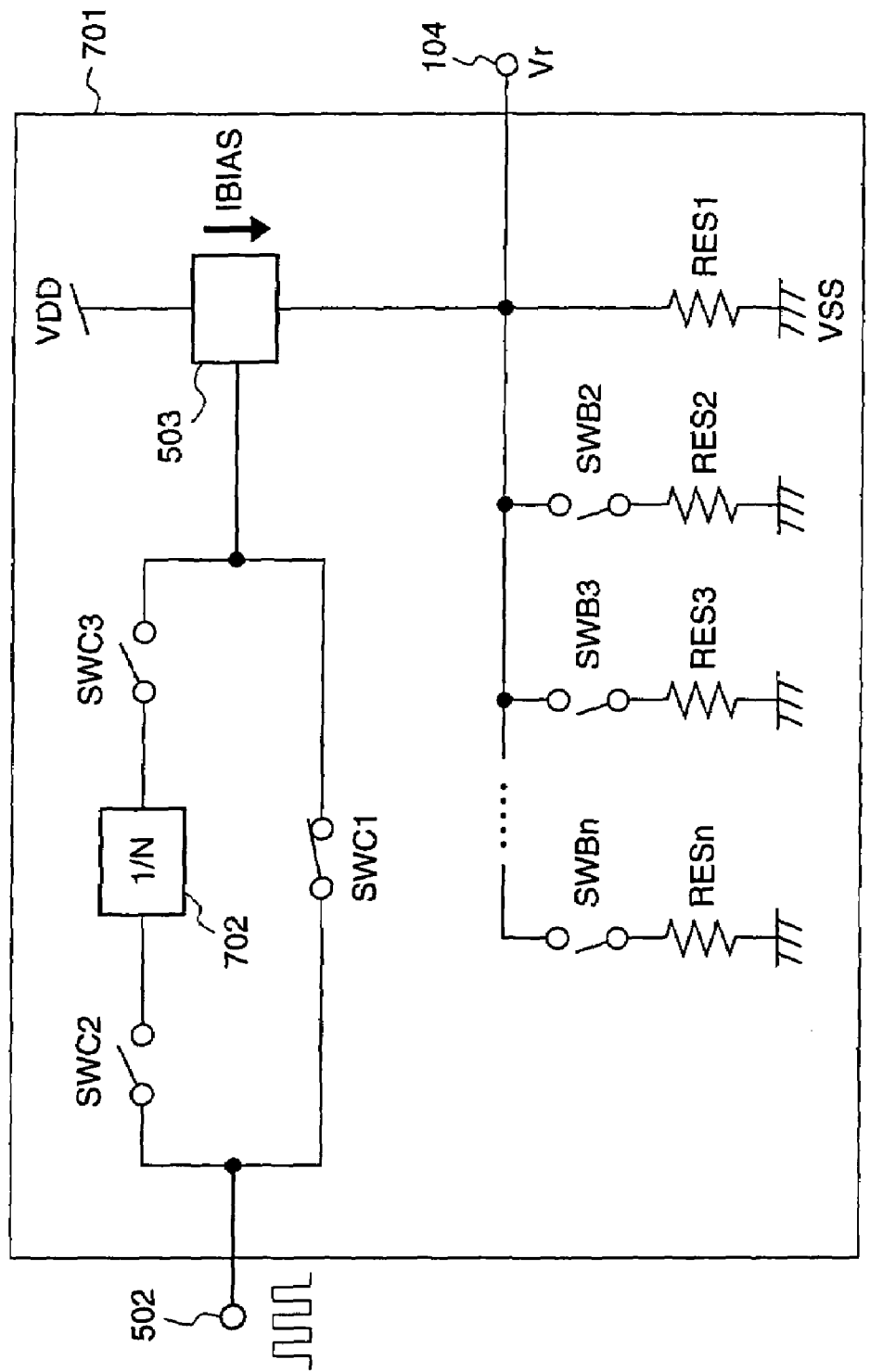
FIG. 9 is a block diagram illustrating a reference voltage generation circuit according to a seventh embodiment of the present invention.
Figure 10:
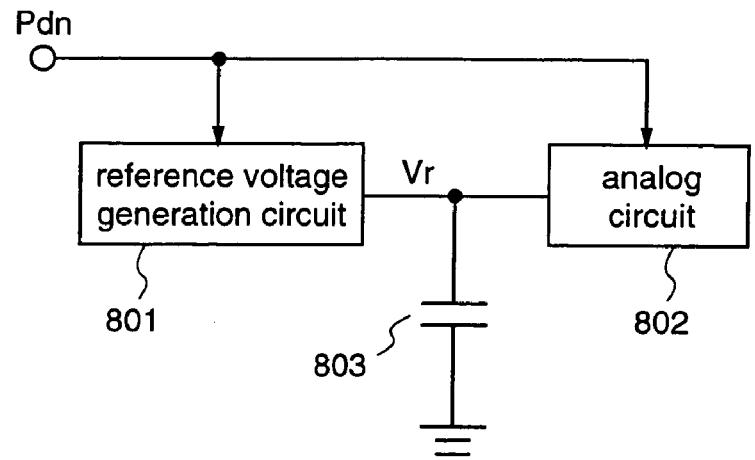
FIG. 10 is a block diagram illustrating a conventional semiconductor integrated circuit.
Figure 11:
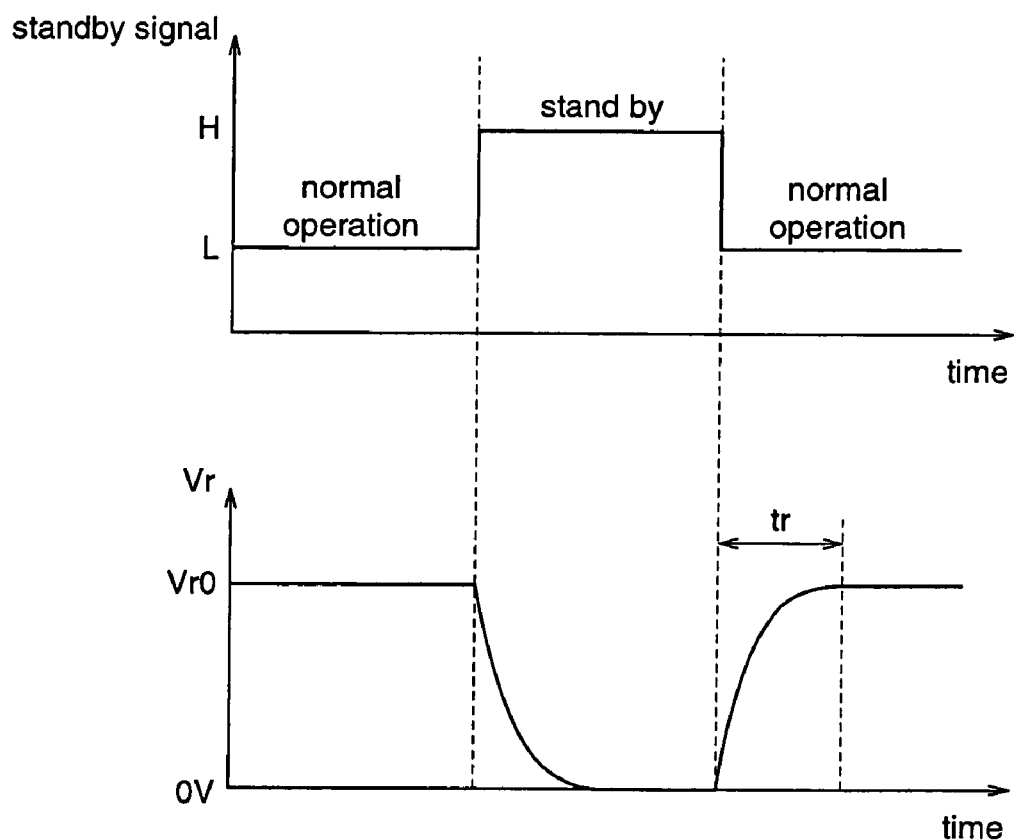
FIG. 11 is a waveform chart of an output voltage of a reference voltage generation circuit included in the prior art semiconductor integrated circuit.

FIG. 9 is a block diagram illustrating the reference voltage generation circuit included in the semiconductor integrated circuit according to the seventh embodiment. In FIG. 9, the same reference numerals as those described for the sixth embodiment denote the same or corresponding parts.

In FIG. 9, a reference voltage generation circuit 701 is provided with a frequency divider 702 for reducing the frequency of an inputted clock signal to 1/n, and switches SWC1~SWC3 for changing the connection of the frequency divider 702.

Next, the operation of the semiconductor integrated circuit according to the seventh embodiment will be described.

During normal operation, the switches SWC1 and SWB2~SWBn are closed, and a current that depends on the frequency of the clock signal inputted to the clock input terminal 502 flows from the clock-frequency-dependent current supply 503 into the resistive loads RES1~RESn, thereby generating an output terminal voltage Vr.

During standby, the switch SWC1 is opened while the switches SWC2 and SWC3 are closed by the standby signal, whereby the clock signal inputted to the clock input terminal 502 is supplied to the clock-frequency-dependent current supply 503 through the frequency divider 702. Simultaneously, the switches SWB2~SWBn are opened, whereby the resistor elements RES2~RESn are disconnected from the output terminal 104. Thereby, the current of the frequency-dependent current supply 503 becomes 1/n of that at normal operation and the resistance value of each resistor element becomes n times as high as that at normal operation, and therefore, the output terminal voltage remains unchanged from that at normal operation. Accordingly, as shown in the output voltage waveform chart of FIG. 2, the output voltage Vr does not change even at standby, and the electric charge stored in the reference voltage stabilization capacitor 103 does not change.

Therefore, when standby is canceled, it is not necessary to recharge the reference voltage stabilization capacitor 103, resulting in a reduction in time required for the analog circuit to recover to the normal operation state.

As described above, the semiconductor integrated circuit according to the seventh embodiment is provided with the clock input terminal which enables inputting of a clock signal, the clock-frequency-dependent current supply for varying the current value in proportion to the inputted clock frequency, the frequency divider for reducing the frequency of the inputted clock signal to 1/N, and the N pieces of resistor elements. During standby, the frequency of the clock signal supplied from the clock input terminal is reduced to 1/N by the frequency divider, and the current value is varied according to the frequency of the clock signal by the clock-frequency-dependent current supply, resulting in a reduction in recovery time from the standby state to the normal operation state as well as a further reduction in power consumption during standby.

Further, since the frequency divider is used, it is not necessary to change the frequency of the clock supplied from the outside, whereby the system design is simplified.

While in this seventh embodiment resistor elements are employed as resistive loads, transistors may be employed.

What is claimed is:

1. A semiconductor integrated circuit comprising:
  a reference voltage generation circuit for generating a voltage to be a reference, said reference voltage generation circuit comprising: a clock input terminal which enables inputting of a clock signal; and a clock-frequency-dependent current supply providing an output current whose value varies in proportion to the frequency of the inputted clock signal;
  a function circuit that is operated using an output voltage of the reference voltage generation circuit; and
  a reference voltage stabilization capacitor for stabilizing the output voltage, which is connected to an output terminal of the reference voltage generation circuit;
  wherein, during standby:
    the function circuit stops operating;
    the reference voltage generation circuit: continues operating; decreases current consumption by a predetermined amount; and outputs the same voltage as during normal operation; and
    the clock frequency is reduced to decrease current consumption of the clock-frequency-dependent current supply by a predetermined amount.

2. A semiconductor integrated circuit as defined in claim 1 wherein
  said reference voltage generation circuit comprises N (N: natural number not less than 2) resistive loads connected in parallel, which are connected to the output terminal of the reference voltage generation circuit; and
  during standby, M (M: natural number not less than 1) resistive loads among the N resistive loads are disconnected from the output terminal.

3. A semiconductor integrated circuit as defined in claim 2 wherein said resistive loads are transistors.

4. A semiconductor integrated circuit as defined in claim 1 wherein
  said reference voltage generation circuit comprises a frequency divider for reducing the inputted clock signal;
  during normal operation, a clock signal is input to the clock-frequency-dependent current supply by bypassing the frequency divider; and during standby, a clock signal is input to the frequency dependent current supply via the frequency divider.

5. A semiconductor integrated circuit as defined in claim 2 wherein
said reference voltage generation circuit comprises a frequency divider for reducing the inputted clock signal;
during normal operation, a clock signal is input to the clock-frequency-dependent current supply by bypassing the frequency divider; and
during standby, a clock signal is input to the frequency dependent current supply via the frequency divider.

6. A semiconductor integrated circuit as defined in claim 3 wherein
said reference voltage generation circuit comprises a frequency divider for reducing the inputted clock signal;
during normal operation, a clock signal is input to the clock-frequency-dependent current supply by bypassing the frequency divider; and
during standby, a clock signal is input to the frequency dependent current supply via the frequency divider.

* * * * *